(12) United States Patent
Ban et al.

(10) Patent No.: US 6,589,837 B1
(45) Date of Patent: Jul. 8, 2003

(54) BURIED CONTACT STRUCTURE IN SEMICONDUCTOR DEVICE AND METHOD OF MAKING THE SAME

(75) Inventors: Hyo-Dong Ban, Kyonggi-do (KR); Young-Hun Park, Kyonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/688,275

(22) Filed: Oct. 12, 2000

(30) Foreign Application Priority Data

Oct. 13, 1999 (KR) ........................... 1999-44341

(51) Int. Cl.[7] ........................................ H01L 21/8242
(52) U.S. Cl. .................. 438/239; 438/244; 438/253; 438/622
(58) Field of Search ................... 438/239, 240, 438/244, 253, 259, 279, 618, 622, 737, 738, 740, 623, 624, 625, 626, 627, 634, 638, 639, 640, 255, 396, 397, 398; 257/296, 303, 306, 750, 755, 758, 759

(56) References Cited

U.S. PATENT DOCUMENTS 5,409,855 A * 4/1995 Jun ........................... 437/42
6,020,236 A * 2/2000 Lee et al. ................... 438/253
6,087,212 A * 7/2000 Hirota ........................ 438/238
6,177,307 B1 * 1/2001 Tu et al. ..................... 438/241
6,187,624 B1 * 2/2001 Huang ........................ 438/253
6,235,619 B1 * 5/2001 Miyakawa ................. 438/585
6,291,888 B1 * 9/2001 Bhat et al. ................. 257/758
6,348,375 B1 * 2/2002 Lee et al. ................... 438/253
2002/0098673 A1 * 7/2002 Yeh et al. ................... 438/618

* cited by examiner

Primary Examiner—Tom Thomas
Assistant Examiner—Douglas W. Owens
(74) Attorney, Agent, or Firm—Marger Johnson & McCollom, P.C.

(57) ABSTRACT

A first interlayer insulating layer is formed over a semiconductor substrate having a semiconductor element. A first line is formed on the first interlayer insulating layer and is connected to the semiconductor element via a contact hole. A second interlayer insulating layer is formed over the first line and the first interlayer insulating layer. An etch barrier layer is formed on the second interlayer insulating layer. A buried contract hole extends through the etch barrier layer and the first and second interlayer insulating layers. An insulating spacer is formed on the side walls of the buried contact hole. A second line is formed on the etch barrier layer and connected to the semiconductor element via the buried contact hole. The buried contact hole has a substantially vertical profile at a top end thereof to provide a sufficient misalignment margin between the buried contact hole and the second line.

27 Claims, 15 Drawing Sheets

BURIED CONTACT STRUCTURE IN SEMICONDUCTOR DEVICE AND METHOD OF MAKING THE SAME

BACKGROUND OF THE INVENTION

1. Field of the Invention

The present invention relates to a semiconductor device and a method for making the semiconductor device, and more particularly to a buried contact hole structure.

2. Description of the Related Art

Recently, the design rule of highly integrated semiconductor memory devices has been reduced from about 1 μm, i.e., the level of mega-bit grade DRAMs, to about 0.15 μm, i.e., the level of giga-bit grade DRAMs. Due to such a reduction in a design rule, the size of a contact hole, which forms an electrical contact with a silicon substrate, has also been reduced. Because such a reduction in design rule in a vertical direction has been implemented using a three-dimensional capacitor structure, an aspect ratio has also been increased. However, the reduction in the diameter of the contact hole and the increased aspect ratio burdens a subsequent photolithography process. The design rule is one of the factors associated with so-called process limitations. In particular, the alignment tolerance in the deep submicron design rule is an important factor for determining a fatal failure of devices.

Development efforts associated with DRAM techniques have focused on an increase in capacitance within a limited unit area. As a result, capacitor structures have been developed from a planar cell structure to a stacked or trenched structure. Also, the stacked capacitor structure has been further developed to provide an increased effective capacitor area, e.g., using a cylinder or fin type capacitor structure.

Similar capacitor structure developments have been made in terms of the process sequence. That is, capacitor structures have been developed from a capacitor-under-bit-line (CUB) structure, in which capacitors are formed prior to the formation of bit lines, to a capacitor-over-bit-line (COB) structure, in which capacitors are formed after the formation of bit lines. In accordance with the COB structure, capacitors can be formed irrespective of the process margin given for a bit line process because the capacitors are formed after the formation of bit lines. Accordingly, the COB structure significantly increase capacitance within a limited cell area, as compared to the CUB structure. In other words, because the capacitors are formed over bit lines in the COB structure, storage node electrodes can have a maximum size determined by a limit given for the photolithography process, thereby providing a large capacitance.

However, such a COB structure increase the aspect ratio of a buried contact hole adapted to connect a storage node electrode to an active region of the device. Also, the misalignment margin between the storage node electrode and buried contact hole is reduced. In order to increase the misalignment margin between the storage node electrode and buried contact hole, it is necessary to reduce the buried contact hole to a minimum size, but it is also necessary to prevent the buried contact hole from being not-open, while increasing the storage node to a maximum size without causing the storage node to be bridged with neighboring storage nodes.

FIGS. 1 to 4 are cross-sectional views illustrating a conventional method for forming buried contacts in a semiconductor device.

Referring to FIG. 1, over a semiconductor substrate 10, a field oxide film 11 is formed using a well-known device isolation process, thereby defining, within the substrate 10, an active region and a field region. Thereafter, MOS transistors (not shown), each of which has a word line, and source and drain regions, are formed on the substrate 10.

Subsequently, an oxide film (not shown) is formed over the resulting structure obtained after the formation of the MOS transistors. The oxide film is then etched using a photoetching process, thereby forming contact holes (not shown) through which the source and drain regions of the MOS transistors are exposed. Over the resulting structure, a doped-polysilicon layer is deposited, and then the resulting structure is patterned to form landing pads 12 contacting respective source and drain regions. The landing pads 12 serve to reduce the aspect ratios of bit line contact holes and buried contact holes to be formed in a subsequent process.

A first interlayer insulating layer 13 is then formed over the resulting structure obtained after the formation of the landing pads 12. The first interlayer insulating layer 13 is etched using a photoetching process, thereby forming bit line contact holes (not shown) through which the landing pads 12 formed on the respective drain regions are exposed. Thereafter, a doped polysilicon layer 14, a tungsten silicide layer 15, and a capping layer (not shown) are sequentially formed over the resulting structure, and then patterned using a photoetching process, thereby forming bit lines 16 each having a polycide structure.

A second interlayer insulating layer 17 is formed over the resulting structure obtained after the formation of the bit lines 16. A high temperature oxide (HTO) film 18 is subsequently deposited over the second interlayer insulating layer 17. Using a photolithography process, a photoresist pattern 19 is then formed on the HTO film 18 in order to define buried contact hole regions. Thereafter, the HTO film 18, second interlayer insulating layer 17, and first interlayer insulating layer 13 are etched using the photoresist pattern 19 as a mask, thereby forming buried contact holes 20 through which the landing pads 12 formed on the respective source regions are exposed.

Referring to FIG. 2, removal of the photoresist pattern 19 is then carried out using an etching and stripping process. Thereafter, a nitride film is deposited over the resulting structure, and then etched back in accordance with a plasma dry etching process, thereby forming nitride spacers 22 on the side walls of the buried contact holes 20. In this case, an over-etching is conducted to completely open the bottom surface of each buried contact hole 20. During the etching process, the HTO film 18 is incidentally etched along with the nitride film at the top end of each buried contact hole 20 because of an insufficient etch selectivity between the nitride film and oxide film. As a result, the HTO film 18 has a slope or rounded corner at the top end of each buried contact hole 20, as shown in FIG. 2. Thus, each buried contact hole 20 has a flared opening at the top end thereof.

Referring to FIG. 3, a doped polysilicon layer 24 is then deposited over the resulting structure in such a manner that it completely fills the buried contact holes 20 a desired thickness.

Subsequently, a photoresist pattern 25 is formed on the polysilicon layer 24 using a photolithography process in order to define storage node regions, as shown in FIG. 4. Using the photoresist pattern 25 as a mask, the polysilicon layer 24 is then etched in accordance with a plasma dry etching process, thereby forming storage node electrodes 24a being connected to the landing pads 12 on the source regions via the buried contact holes 20.

The photoresist film pattern, which is to be used in the photoetching process for patterning the polysilicon layer for storage node electrodes, may often be misaligned from the buried contact holes. In such a case, however, the above mentioned conventional method involves problems because each buried contact hole has an inclined? top portion. That is, when the etching process is conducted at the inclined top portion of each buried contact hole, etching ions may scatter at that portion due to the above mentioned misalignment, thereby deflecting the etching direction. As a result, each storage node electrode may have a shape in which the polysilicon layer is partially recessed at a region corresponding to the top portion of the associated buried contact hole, as indicated by the reference numeral 26 in FIG. 4. This results in a reduction in the cross-sectional area of the storage polysilicon layer at the top end of each buried contact hole, thereby causing an increase in contact resistance. Furthermore, it is impossible to form a dielectric layer having a uniform thickness in a subsequent process. As a result, a leakage of cell capacitance and malfunction of the device may occur.

The above mentioned problems may be more severe when the misalignment margin between the storage node electrode and the buried contact hole is reduced by virtue of a reduction in design rule.

SUMMARY OF THE INVENTION

Therefore, an object of the invention is to provide a buried contact hole structure in a semiconductor device and a method for making the buried contact hole structure which are capable of providing a sufficient misalignment margin between a buried contact hole and a line arranged over the buried contact hole.

According to one aspect of the present invention, a semiconductor device comprises a semiconductor substrate having a semiconductor element formed on an upper surface of the semiconductor substrate; a first interlayer insulating layer formed over the semiconductor substrate, the first interlayer insulating layer having a contact hole; a first line formed on the first interlayer insulating layer in such a fashion that it is connected to the semiconductor element via the contact hole; a second interlayer insulating layer over the first line and the first interlayer insulating layer; an etch barrier layer formed on the second interlayer insulating layer; a buried contract hole extending through both the etch barrier layer and the second interlayer insulating layer in such a fashion that the semiconductor element is exposed; an insulating spacer formed on an inner side wall of the buried contact hole; and a second line formed on the etch barrier layer in such a fashion that it is connected to the semiconductor element via the buried contact hole; and wherein the buried contact hole has a vertical profile at a top end thereof to provide a sufficient misalignment margin between the buried contact hole and the second line.

Preferably, the semiconductor device further comprises a pair of landing pads interposed between the semiconductor element and the first interlayer insulating layer and connected to the semiconductor element. The landing pads are spaced apart from each other by a desired distance extending in a direction parallel to the upper surface of the semiconductor substrate. In this case, the first line is connected to one of the landing pads, and the second line is connected to the other landing pad.

Preferably, the semiconductor device further comprises a cap insulating layer formed over the etch barrier layer and having a wet etch selectivity with respect to the etch barrier layer. In this case, the buried contact hole extends to the cap insulating layer.

The semiconductor device preferably further comprises a conductive plug formed in the buried contact hole. In this case, the second line is directly connected to the conductive plug.

Preferably, the semiconductor device is a DRAM cell. In this case, the first line is a bit line, and the second line is a storage node electrode of a capacitor.

In accordance with another aspect of the present invention, to fabricate a semiconductor device, a first interlayer insulating layer is deposited over a semiconductor substrate having a semiconductor element formed on an upper surface of the semiconductor substrate. A first line is formed on the first interlayer insulating layer in such a fashion that it is connected to the semiconductor element via a contact hole formed through the first interlayer insulating layer. Then, a second interlayer insulating layer is deposited over the resulting structure. Next, an etch barrier layer is formed on the second interlayer insulating layer. A cap insulating layer having a wet etch selectivity with respect to the second interlayer insulating layer is deposited over the etch barrier layer. Subsequently, the insulating layer, the etch barrier layer, and the second interlayer insulating layer are etched to form a buried contract hole to expose the semiconductor element. An insulating spacer is formed on an inner side wall of the buried contact hole. At least a portion of the cap insulating layer is etched. A conductive layer is deposited over the resulting structure. Then, the conductive layer is patterned to form a second line connected to the semiconductor element via the buried contact hole.

Preferably, the method further comprises the step of forming, prior to the deposition of the first interlayer insulating layer, a pair of spaced landing pads on the semiconductor substrate in such a fashion that they are connected to the semiconductor element.

In accordance with another aspect of the present invention, a method for making a semiconductor device comprises depositing a first interlayer insulating layer over a semiconductor substrate having a semiconductor element formed on an upper surface of the semiconductor substrate; forming a first line on the first interlayer insulating layer in such a fashion that it is connected to the semiconductor element via a contact hole formed through the first interlayer insulating layer; depositing a second interlayer insulating layer over the resulting structure; depositing an etch barrier layer on the second interlayer insulating layer; depositing, over the etch barrier layer, a cap insulating layer having a wet etch selectivity with respect to the etch barrier layer; etching the cap insulating layer, the etch barrier layer, and the second interlayer insulating layer, thereby forming a buried contract hole for exposing the semiconductor element; forming an insulating spacer on an inner side wall of the buried contact hole; depositing a first conductive layer over the resulting structure, and removing the first conductive layer until an upper surface of the insulating layer is exposed, thereby forming a plug in the buried contact hole; wet etching at least a portion of the cap insulating layer; and depositing a second conductive layer over the resulting structure; and patterning the second conductive layer, thereby forming a second line directly connected to the plug.

The first conductive layer is deposited to a thickness capable of sufficiently filling the buried contact hole.

In accordance with the present invention, buried contact holes are formed to have a vertical profile at respective top ends thereof. During a photoetching process for forming storage node electrodes, accordingly, there is no phenomenon that the material of those storage node electrodes is abnormally etched at respective top ends of associated buried contact holes, even when there is a misalignment between the photomask used in the photoetching process and the buried contact holes.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENT

Preferred embodiments of the present invention will be described in detail with reference to the attached drawings.

Figure 15:
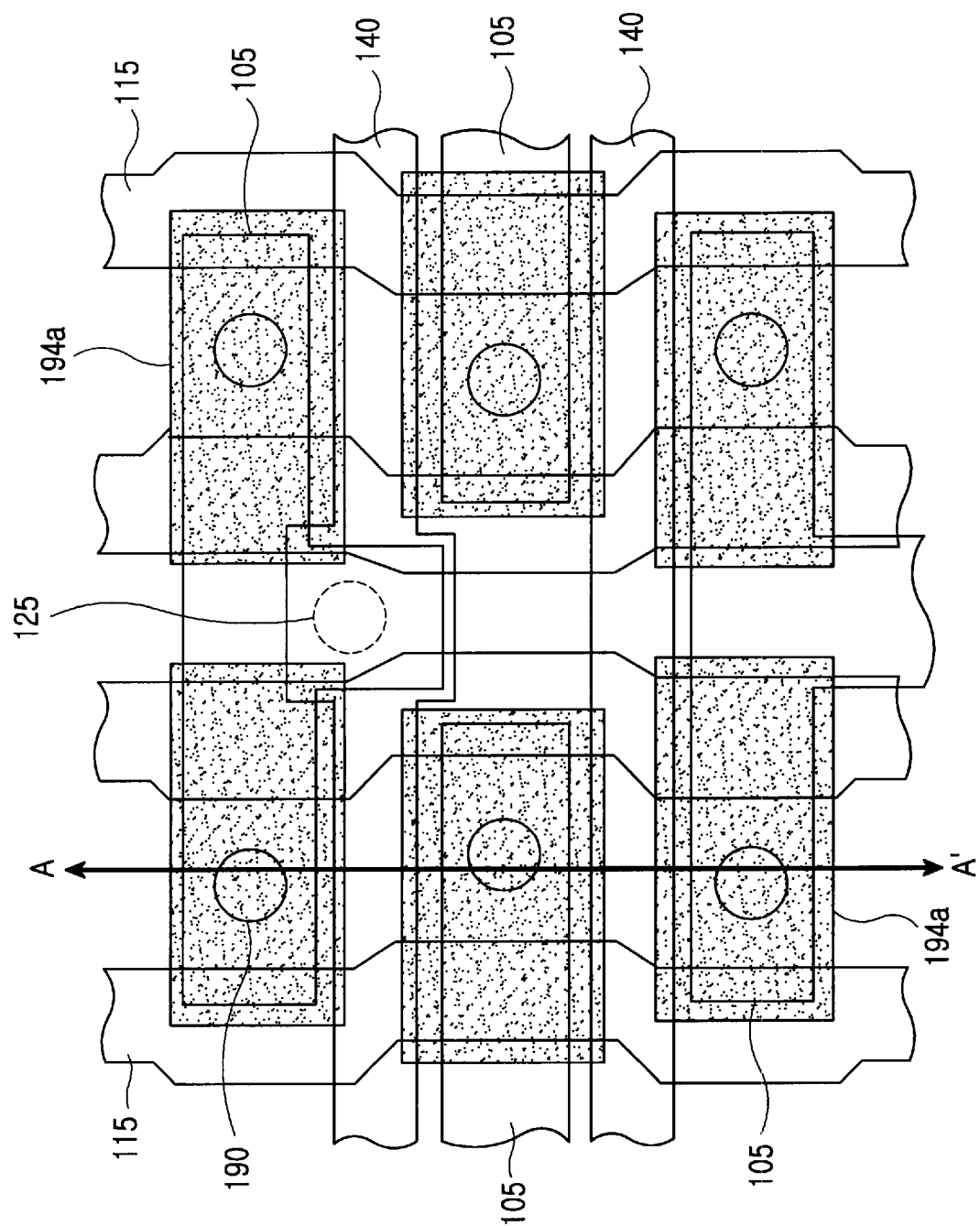
FIG. 15 is a layout view of DRAM cells to which respective embodiments of the present invention are applied.

FIGS. 5 to 10 are cross-sectional views respectively taken along the line A–A' in FIG. 15, illustrating a method for making buried contacts of a semiconductor device in accordance with a first embodiment of the present invention. FIG. 15 is a layout view of DRAM cells to which respective embodiments of the present invention are applied. For clarity in illustration, no landing pad is shown.

Figure 1:
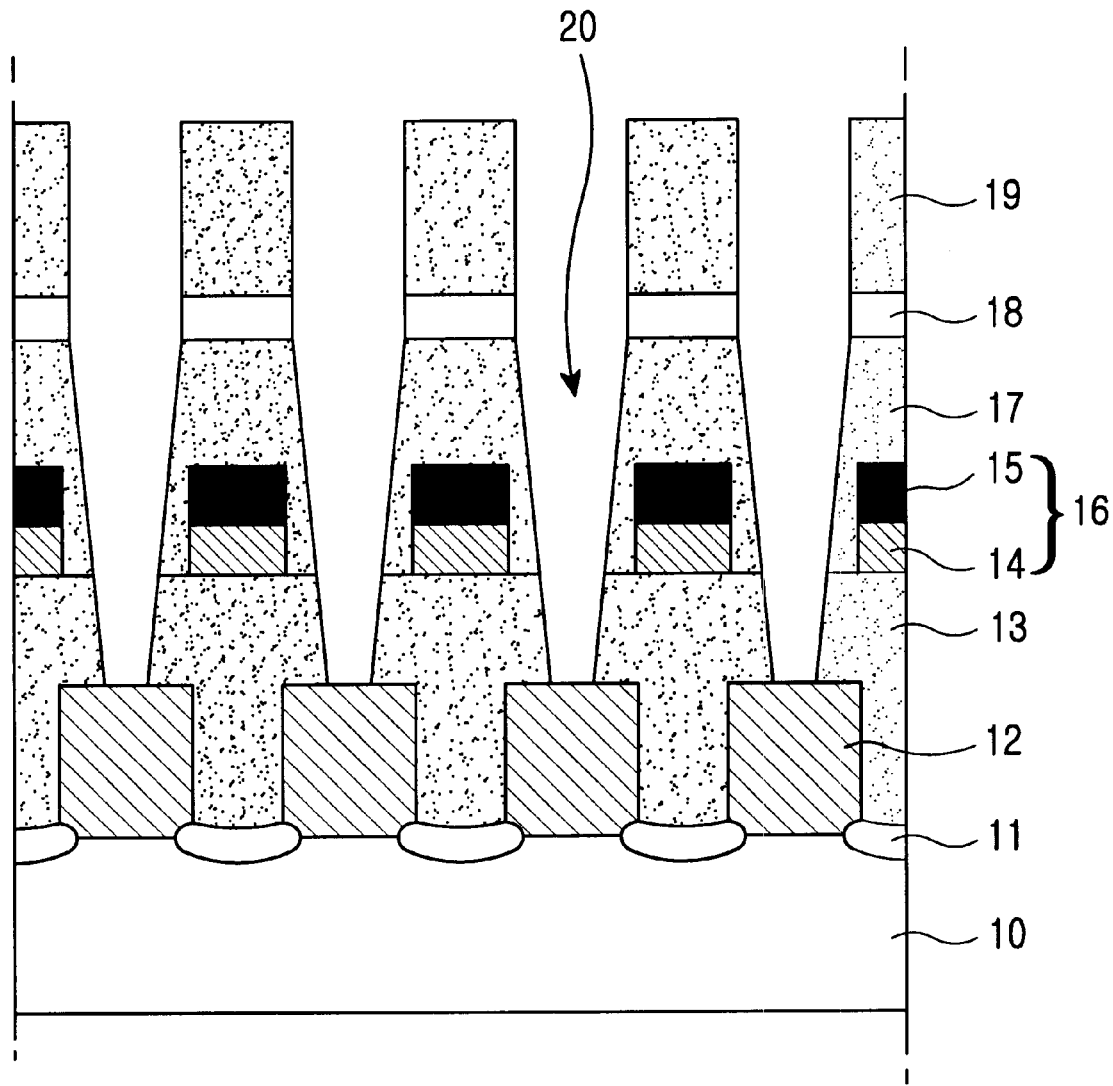
FIGS. 1 to 4 are cross-sectional views illustrating a conventional method for forming buried contacts in a semiconductor device, respectively.
Figure 2:
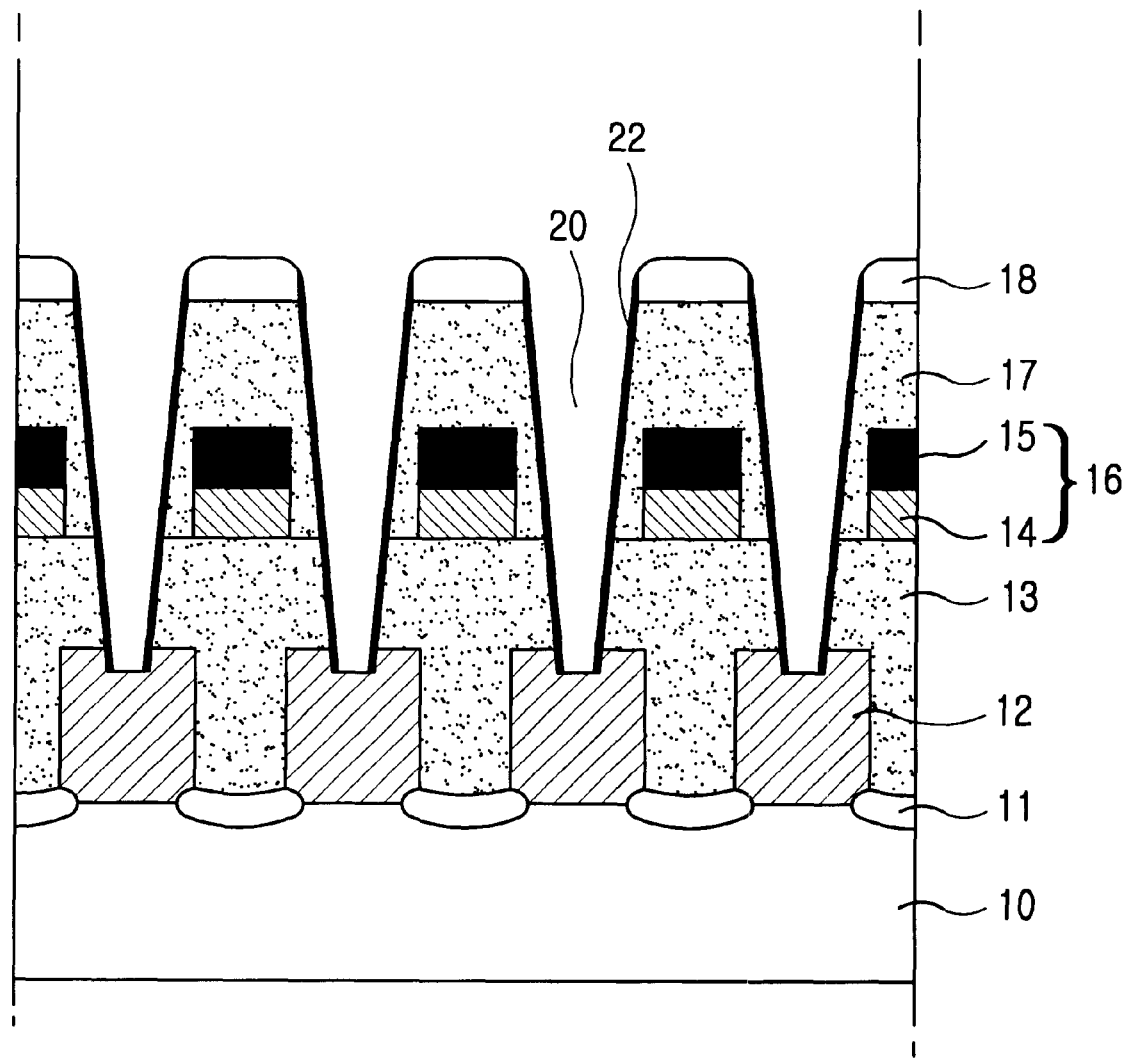
Figure 3:
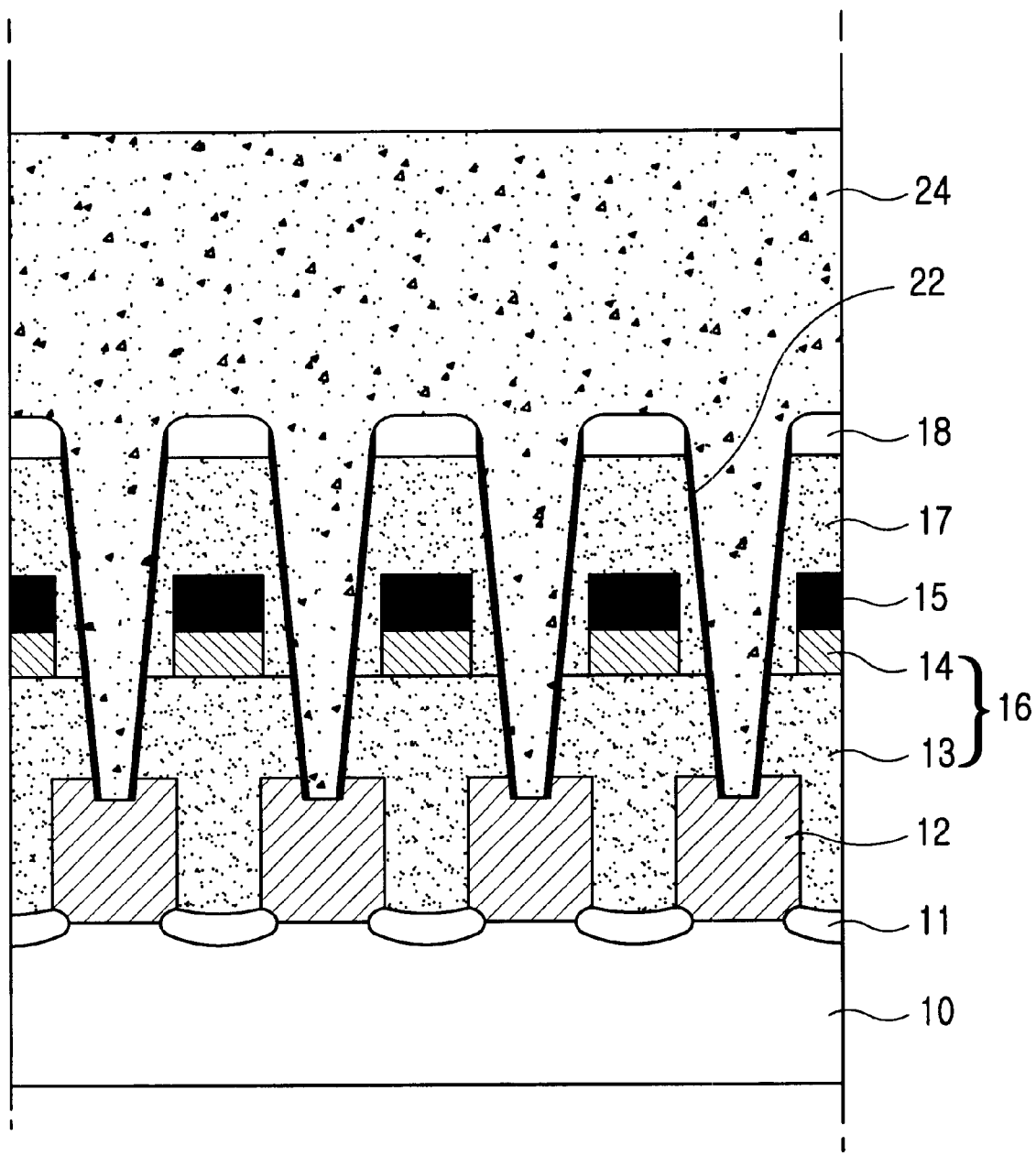
Figure 4:
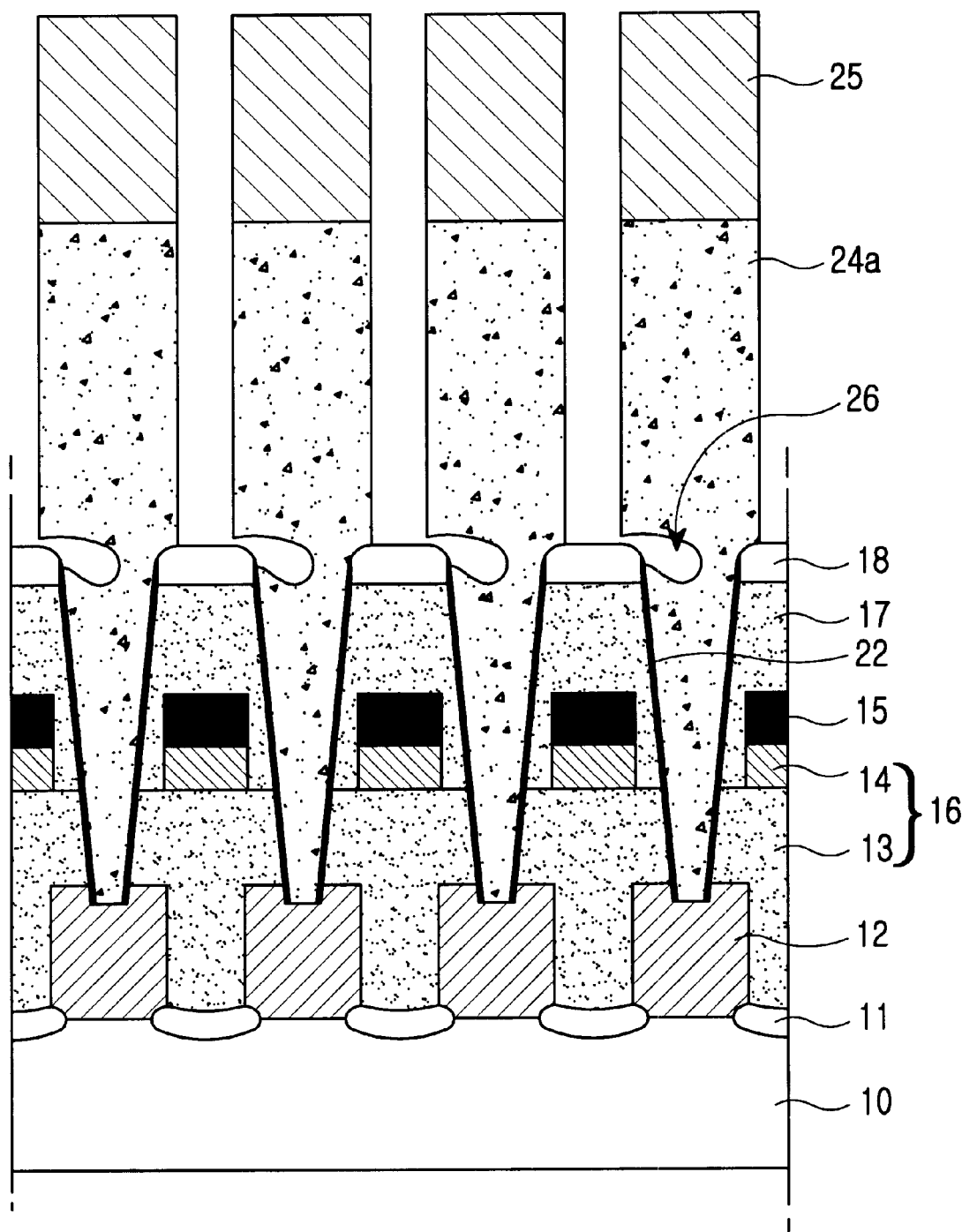
Figure 5:
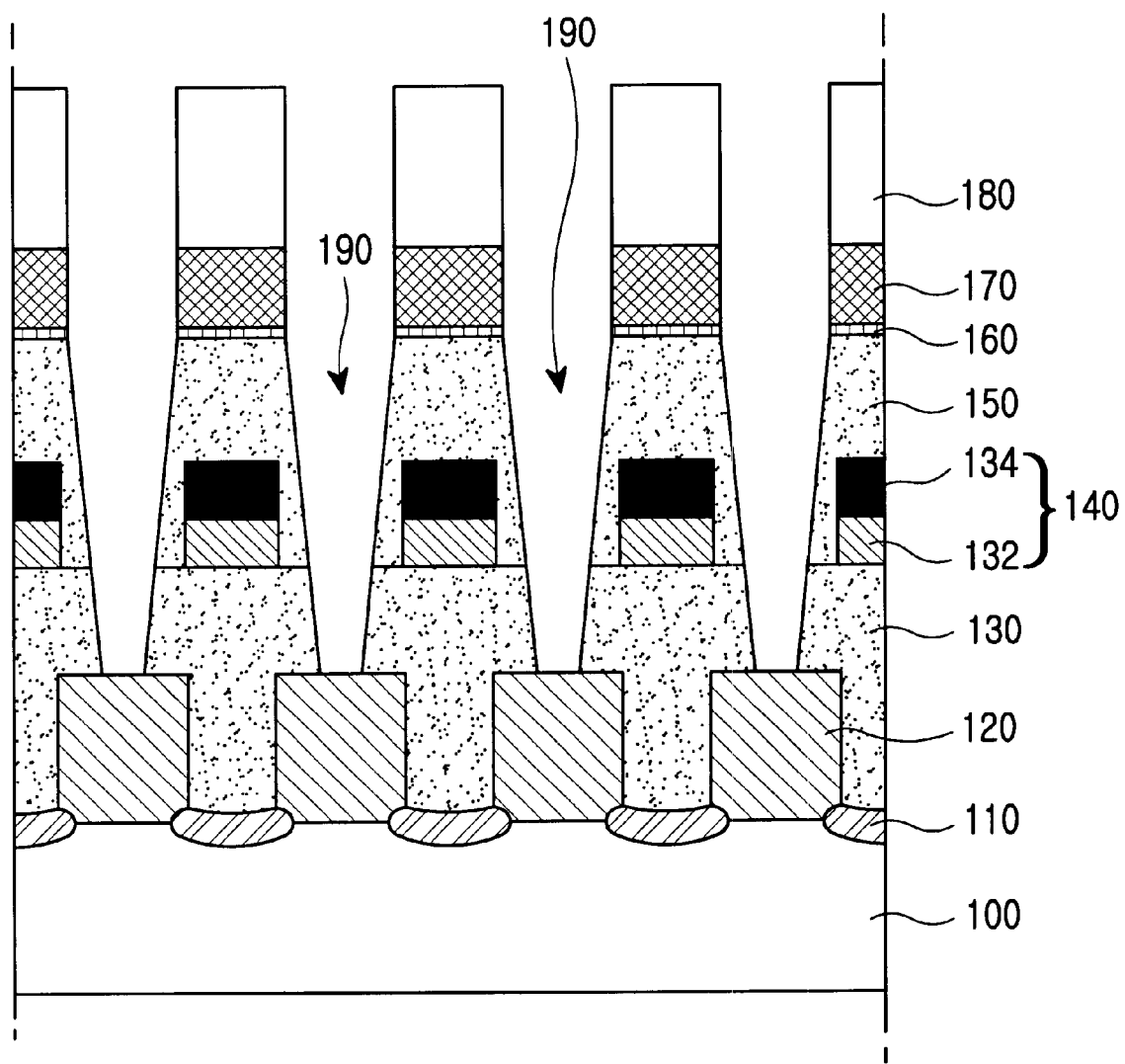
FIGS. 5 to 10 are cross-sectional views respectively taken along the line A–A' in FIG. 15, illustrating a method for making buried contacts of a semiconductor device in accordance with a first embodiment of the present invention.

FIG. 5 illustrates processing steps for forming buried contact holes 190 of the present invention. As shown in FIG. 5, a semiconductor substrate 100 is defined with active regions (denoted by the reference numeral 105 in FIG. 15) and field regions by a field oxide film 110 formed on the semiconductor substrate 100. The formation of the field oxide film 110 is carried out using a well-known device isolation process, for example, an improved local oxidation of silicon (LOCOS) process or a shallow trench isolation process. Thereafter, gate electrodes of MOS transistors to be used as word lines (denoted by the reference numerals 115 in FIG. 15) are formed on the substrate 100. Preferably, the word lines 115 have a polycide structure including a doped polysilicon layer and a tungsten suicide layer. The doping of impurity ions in the polysilicon layer is carried out in a high concentration using a well-known doping process, for example, a diffusion process, an ion implantation process, or an in-situ doping process. The word lines 115 are capped with an oxide film or a nitride film. Nitride spacers are formed on the side walls of the word lines 115. Using the word lines 115 as a mask, impurity ions are then implanted in the substrate 100, thereby forming source and drain regions for the MOS transistors on the active regions 105.

Subsequently, an oxide film (not shown) is deposited over the resulting structure to a thickness sufficient to cover the word lines 115. The oxide film is then etched using a photoetching process, thereby forming contact holes through which the source and drain regions of the MOS transistors are exposed. Over the resulting structure, a doped polysilicon film is then deposited to a thickness of about 1,000 Å. The deposited doped polysilicon film is patterned to form landing pads 120 to be connected to the source or drain regions. The landing pads 120 reduce the aspect ratio of bit line contact holes for connecting drain regions to bit lines and also reduce the aspect ratio of buried contact holes for connecting source regions to storage node electrodes.

A borophosphosilicate glass (BPSG) or undoped silicate glass (USG) exhibiting superior planarization characteristics is then deposited to a thickness of 2,000 to 8,000 Å over the resulting structure obtained after the formation of the landing pads 120, thereby forming a first interlayer insulating layer 130. The first interlayer insulating layer 130 is then planarized using conventional techniques such as a reflow process, an etch-back process or a chemical mechanical polishing (CMP) process.

The planarized first interlayer insulating layer 130 is etched using a photoetching process, thereby forming bit line contact holes (denoted by the reference numeral 125 in FIG. 15) through which the landing pads 120 formed on respective drain regions are exposed. Thereafter, a doped polysilicon layer 132 is deposited to a thickness of about 1,000 Å over the resulting structure. After depositing a tungsten silicide layer 134 over the doped polysilicon layer 132, the deposited layers 134 and 132 are patterned using a photoetching process, thereby forming bit lines 140 each having a polycide structure. The bit lines 140 are then capped with an oxide layer or nitride layer.

Subsequently, a BPSG or USG is deposited over the resulting structure obtained after the formation of the bit lines 140, thereby forming a second interlayer insulating layer 150. The second interlayer insulating layer 150 is then polished using conventional techniques such as a CMP process until it has a planar surface and a thickness of about 2,000 Å over the bit lines 140.

Over the second interlayer insulating layer 150, a nitride film is then deposited to a thickness of about 50 to 150 Å, thereby forming an etch barrier layer 160. Over the nitride film, a material exhibiting a selectivity with respect to the nitride film in an optional wet etching process, for example, an oxide film, is deposited to a thickness of about 500 to 3,000 Å, thereby forming a cap insulating layer 170. Preferably, the insulating layer 170 is comprised of a low temperature oxide (LTO) film or a PE-SiH4 or tetraethoxysilane (TEOS)-based oxide film which exhibits a high etch selectivity. The thickness of the insulating layer 170 is determined at least in part by the etching of the insulating layer 170 to have a slope during a subsequent formation of insulating film spacers.

Thereafter, a photoresist pattern 180 is formed on the insulating layer 170 using a photolithography process in order to define buried contact hole regions. Using the photoresist pattern 180 as a mask, the insulating layer 170, etch barrier layer 160, second interlayer insulating layer 150, and first interlayer insulating layer 130 are then etched, thereby forming buried contact holes 190 through which the landing pads 120 formed on respective source regions are exposed.

Figure 6:
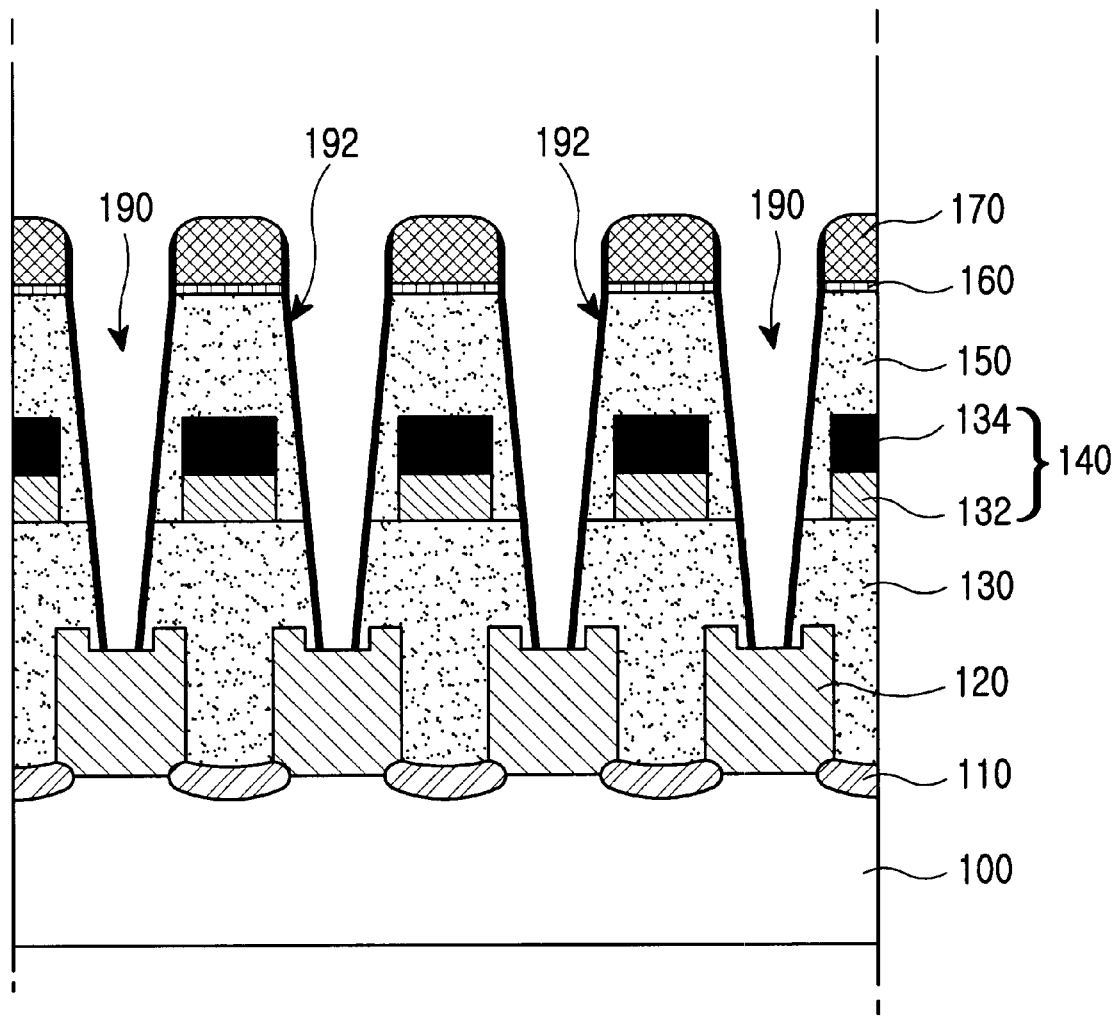

FIG. 6 illustrates a processing step for forming insulating film spacers 192. In accordance with this processing step, the photoresist pattern 180 is removed using an etching and stripping process after the formation of the buried contact holes 190. Subsequently, an insulating layer such as a nitride film is deposited to a thickness of about 200 to 300 Å, and then etched back using a plasma dry etching process, thereby forming insulating film spacers 192 on the side walls of the buried contact holes 190. In this case, an over-etching is conducted for the insulating layer in order to completely open the bottom surface of each buried contact hole 190. During the etching process, the cap insulating layer 170 is incidentally etched along with the nitride film at the top end of each buried contact hole 190 because of an insufficient etch selectivity between the nitride film and the cap insulating layer 170. As a result, the cap insulating layer 170 has a slope. Thus, each buried contact hole 190 has a flared top end thereof. Each insulating film spacer 192 is formed below the top portion of the associated buried contact hole 190 because of the characteristics of the etching process used.

Figure 7:
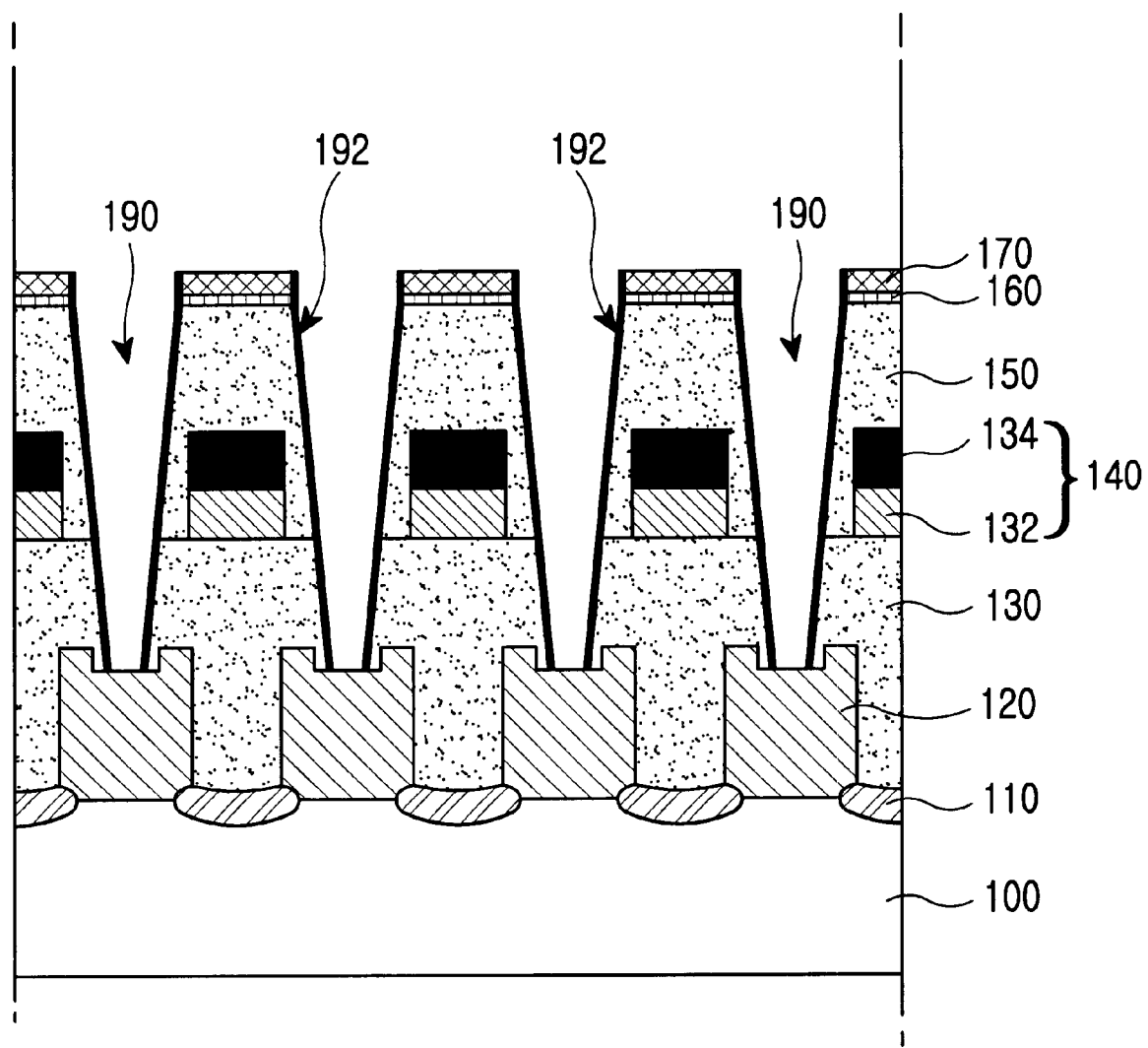

Referring to FIG. 7, the inclined top portion of each buried contact hole 190 is then removed. This is achieved by wet etching the insulating layer 170 using an etchant such as hydrofluoric acid (HF), an SC-1 (Standard Cleaning-1: an organic material consisting of $NH_4OH$, $H_2O_2$, and $H_2O$ mixed together in a ratio of 1:4:20), or a buffered oxide etchant (BOE). In this case, the insulating layer 170 may be completely removed or left to have a desired thickness. Preferably, the etched amount of the insulating layer 170 is determined depending on the formation condition of the insulating film spacers 192. In accordance with the above mentioned wet etching process, each buried contact hole 190 has a vertical profile at its top end. Accordingly, a sufficient misalignment margin can be provided for the buried contact holes 190 in a subsequent photoetching process to form storage node electrodes.

Figure 8:
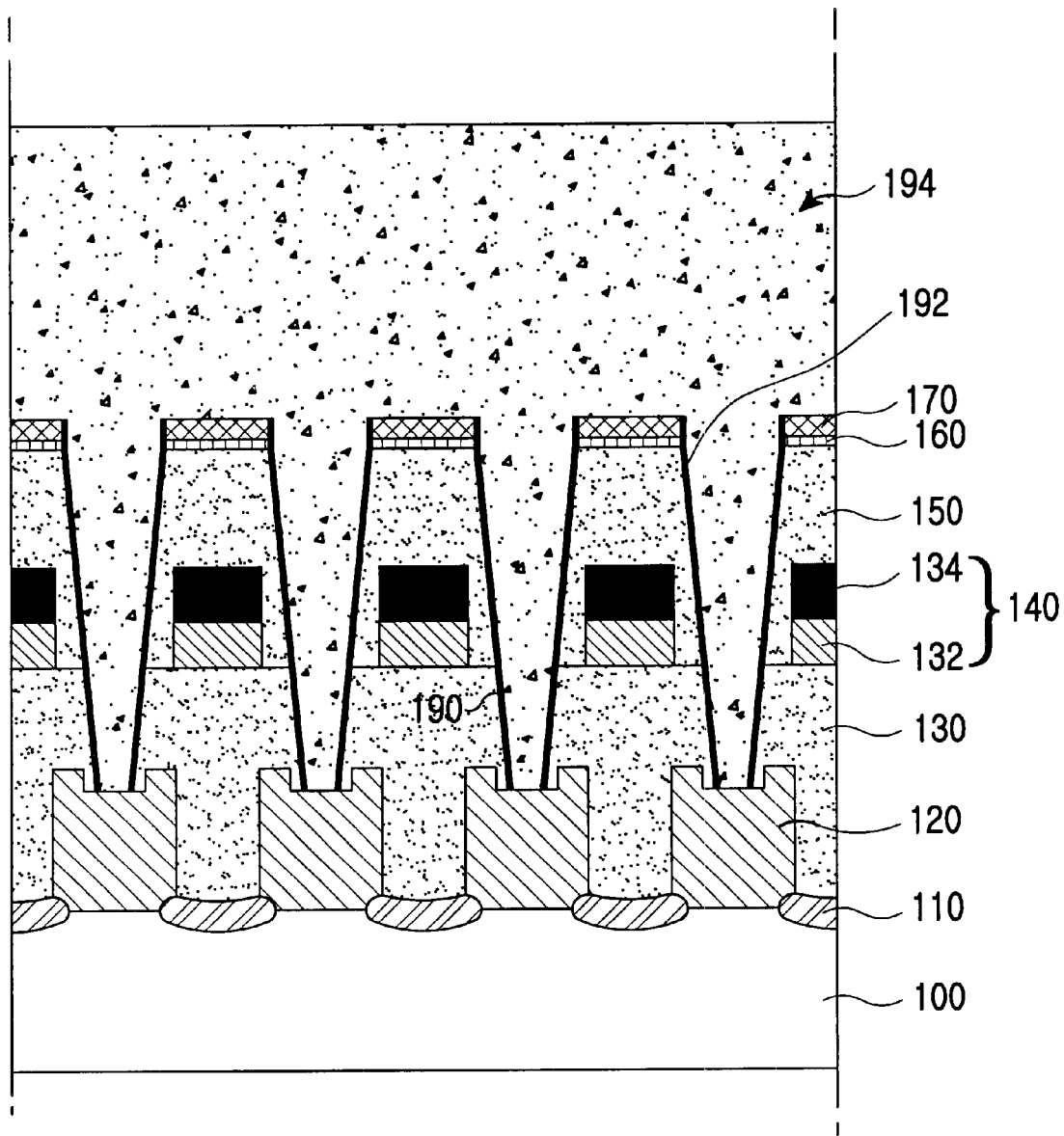

Referring to FIG. 8, a conductive layer 194 such as a doped polysilicon layer is then deposited over the resulting structure to fill the buried contact holes 190 to a desired thickness. Preferably, the conductive layer 194 is deposited to have a thickness of about 5,000 Å or more, taking a desired cell capacitance into consideration.

Figure 9:
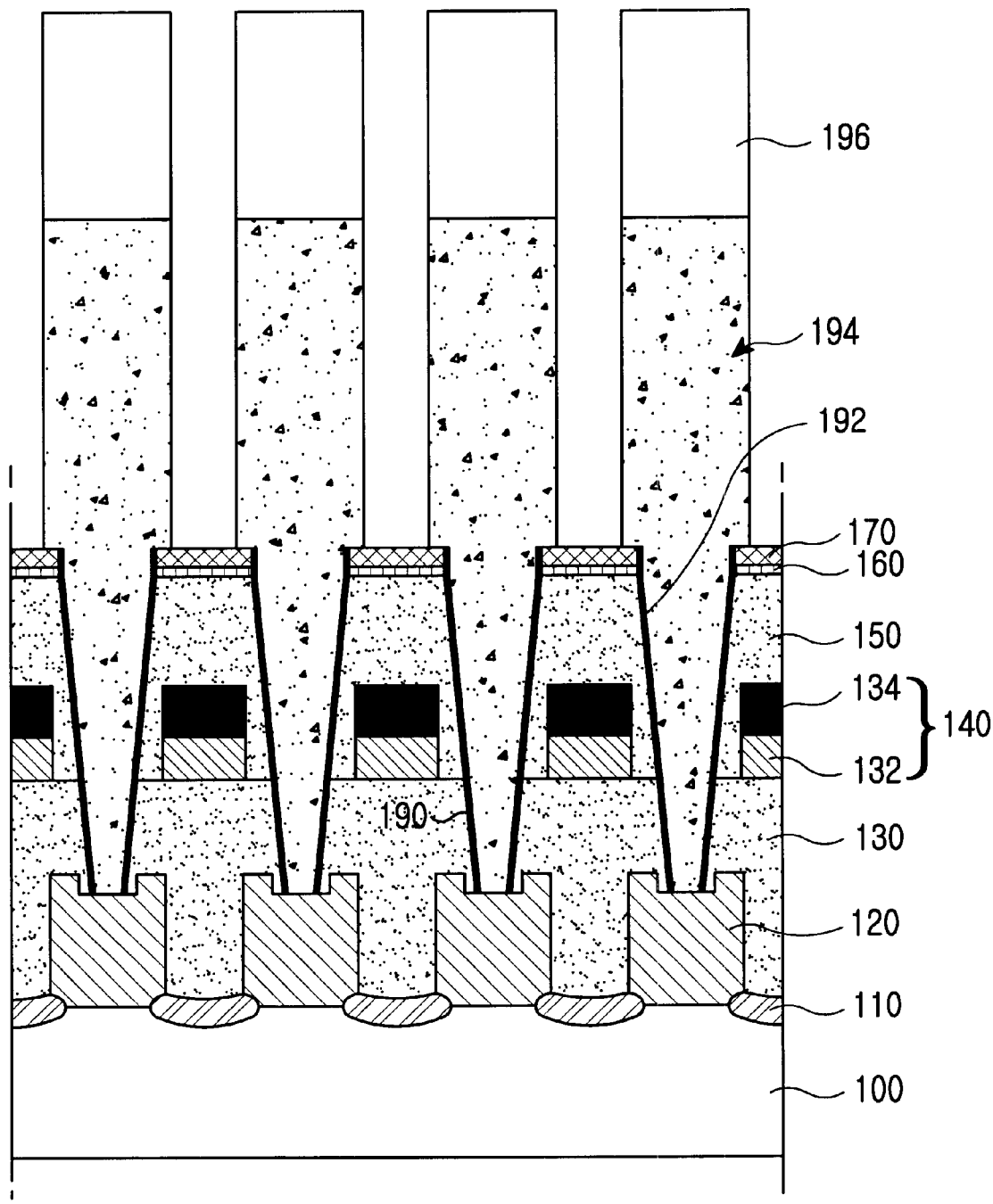

Subsequently, a photoresist pattern 196 is formed on the conductive layer 194 using a photolithography process to define storage node regions, as shown in FIG. 9. Using the photoresist pattern 196 as a mask, the conductive layer 194 is then etched in accordance with a plasma dry etching process. At this time, the conductive layer 194 can be properly etched even when the photoresist pattern 196 is misaligned from the buried contact holes 190. This is because each buried contact hole 190 has a vertical profile at its top portion.

Figure 10:
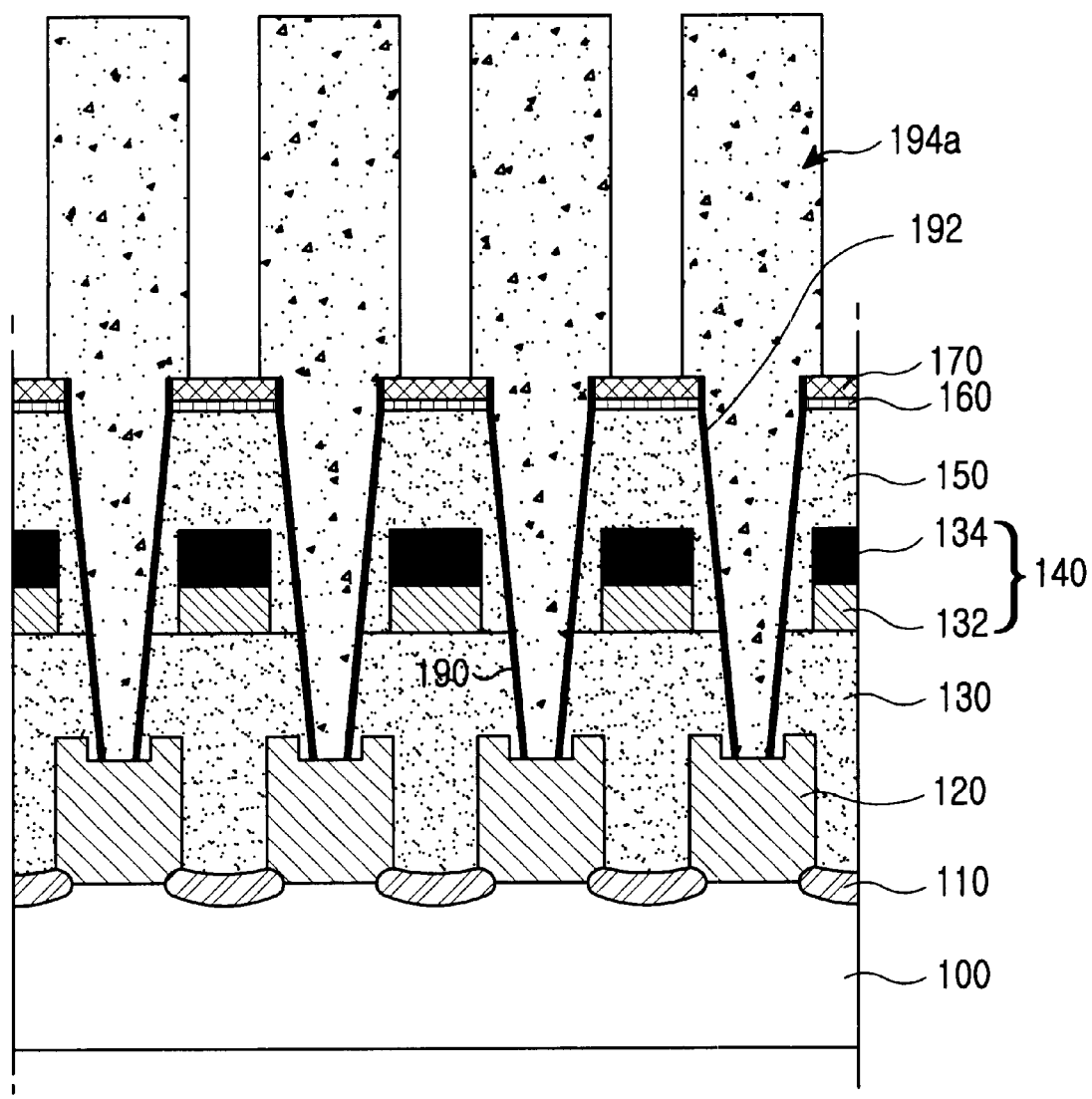

Referring to FIG. 10, the photoresist pattern 196 is then removed using an etching and stripping process. As a result, the formed storage node electrodes 194a are connected to the landing pads 120 on the source regions via the buried contact holes 190.

Although not shown, a dielectric layer and a plate electrode are then sequentially stacked over the storage electrodes 194a. Thus, capacitors are obtained.

FIGS. 11 to 14 are cross-sectional views taken along the line A–A' of FIG. 15, illustrating a method for forming buried contacts of a semiconductor device in accordance with a second embodiment of the present invention.

Figure 11:
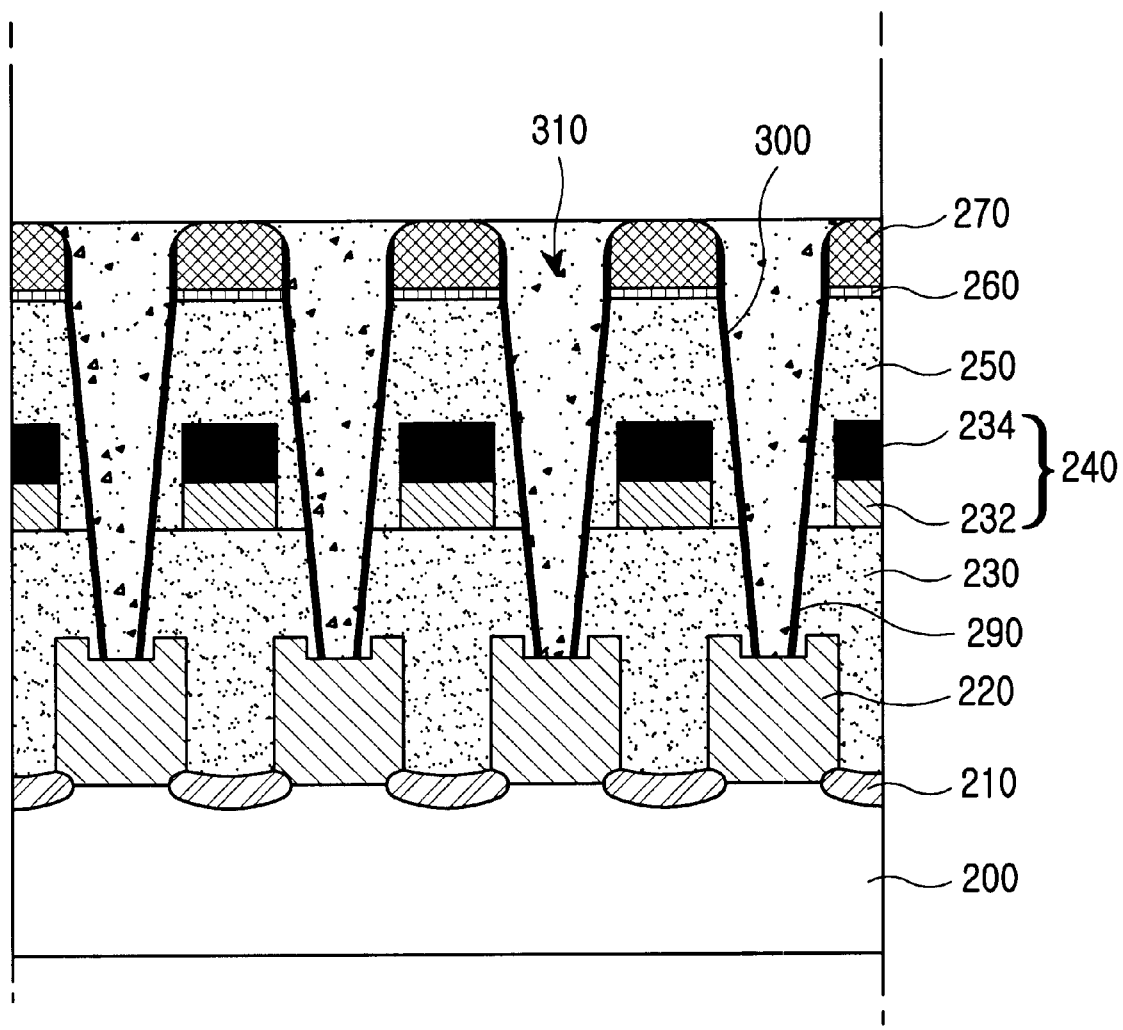
FIGS. 11 to 14 are cross-sectional views respectively taken along the line A–A' of FIG. 15, illustrating a method for forming buried contacts of a semiconductor device in accordance with a second embodiment of the present invention.

Referring to FIG. 11, landing pads 220, a first interlayer insulating layer 230, bit lines 240 that include a doped polysilicon layer 232 and a tungsten silicide layer 234, a second interlayer insulating layer 250, an etch barrier layer 260, and a cap insulating layer 270 are first formed using the same method as the method used in the first embodiment of the present invention. Thereafter, the cap insulating layer 270, etch barrier layer 260, second interlayer insulating layer 250 and first interlayer insulating layer 230 are sequentially etched, thereby forming buried contact holes 290 through which the landing pads 220 formed on drain regions of MOS transistors are exposed.

Subsequently, an insulating layer such as a nitride film is deposited to a thickness of about 200 to 300 Å, and then etched back using a plasma dry etching process, thereby forming insulating film spacers 300 on the side walls of the buried contact holes 290. During the etching process, the cap insulating layer 270 is etched along with the nitride film at the top end of each buried contact hole 290 because of an insufficient etch selectivity between the nitride film and the cap insulating layer 270. As a result, the insulating layer 270 has a slope or rounded corner, as shown. Thus, each buried contact hole 290 has a flared top end thereof. Each insulating film spacer 300 is formed below the top portion of the associated buried contact hole 290 because of the characteristics of the etching process used.

Over the resulting structure, a first conductive layer 310 such as a doped polysilicon film is then deposited to a thickness to fill the buried contact holes 290. The deposited first conductive layer 310 is partially removed using an etch-back process or a CMP process until the upper surface of the insulating layer 270 is exposed. As a result, the first conductive layer 310 is left in the form of plugging bars existing in respective buried contact holes 290. Preferably, the first conductive layer 310 for the plugging bars is comprised of doped polysilicon having a higher dopant concentration than that of a second conductive layer to be subsequently formed. This is because an increase in the doping concentration of the storage node electrode may result in occurrence of bald defects interfering with a growth of hemispherical grain, (HSG) where it is desired to grow hemispherical grains over the surface of a storage node electrode to increase an effective capacitor area. Thus, in accordance with the second embodiment of the present invention, the storage node electrodes are formed by forming plugging bars using a first conductive layer heavily doped in a concentration of 1E20 atoms/cm3 or more and then depositing a second conductive layer doped in a concentration lower than that of the first conductive layer. As a result, a desired cell capacitance can be obtained while achieving a reduction in contact resistance.

Figure 12:
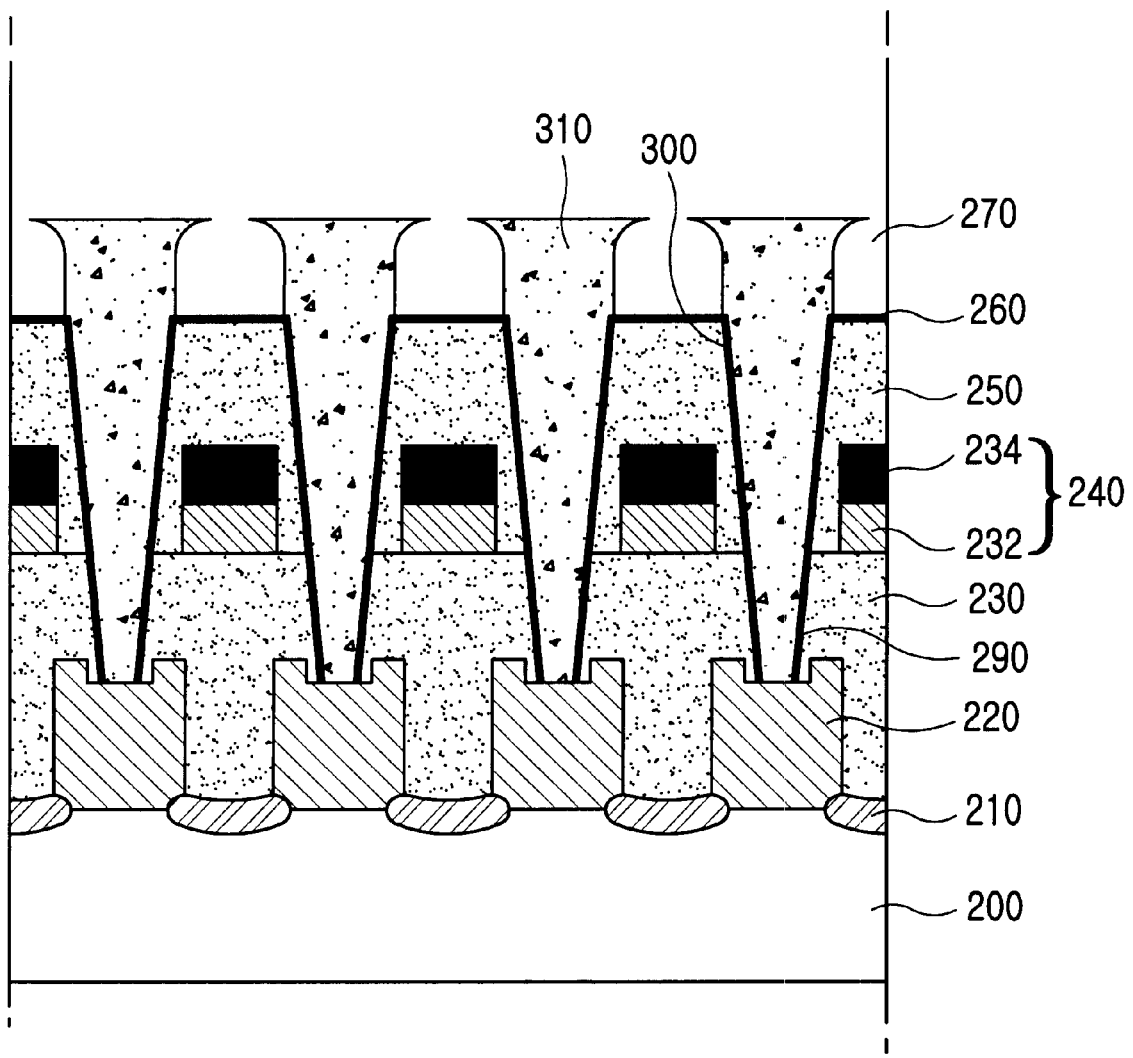

Referring to FIG. 12, the insulating layer 270 is then wet etched using an etchant such as HF, SC-1 or BOE. In this case, the insulating layer 270 may be completely removed or left to have a desired thickness. Preferably, the etched amount of the insulating layer 270 is determined depending on the formation condition of the insulating film spacers 300. In accordance with the above mentioned wet etching process, the inclined top portion of each buried contact hole 290 is removed. In other words, each buried contact hole 290 has a substantially vertical profile at the top end thereof.

Figure 13:
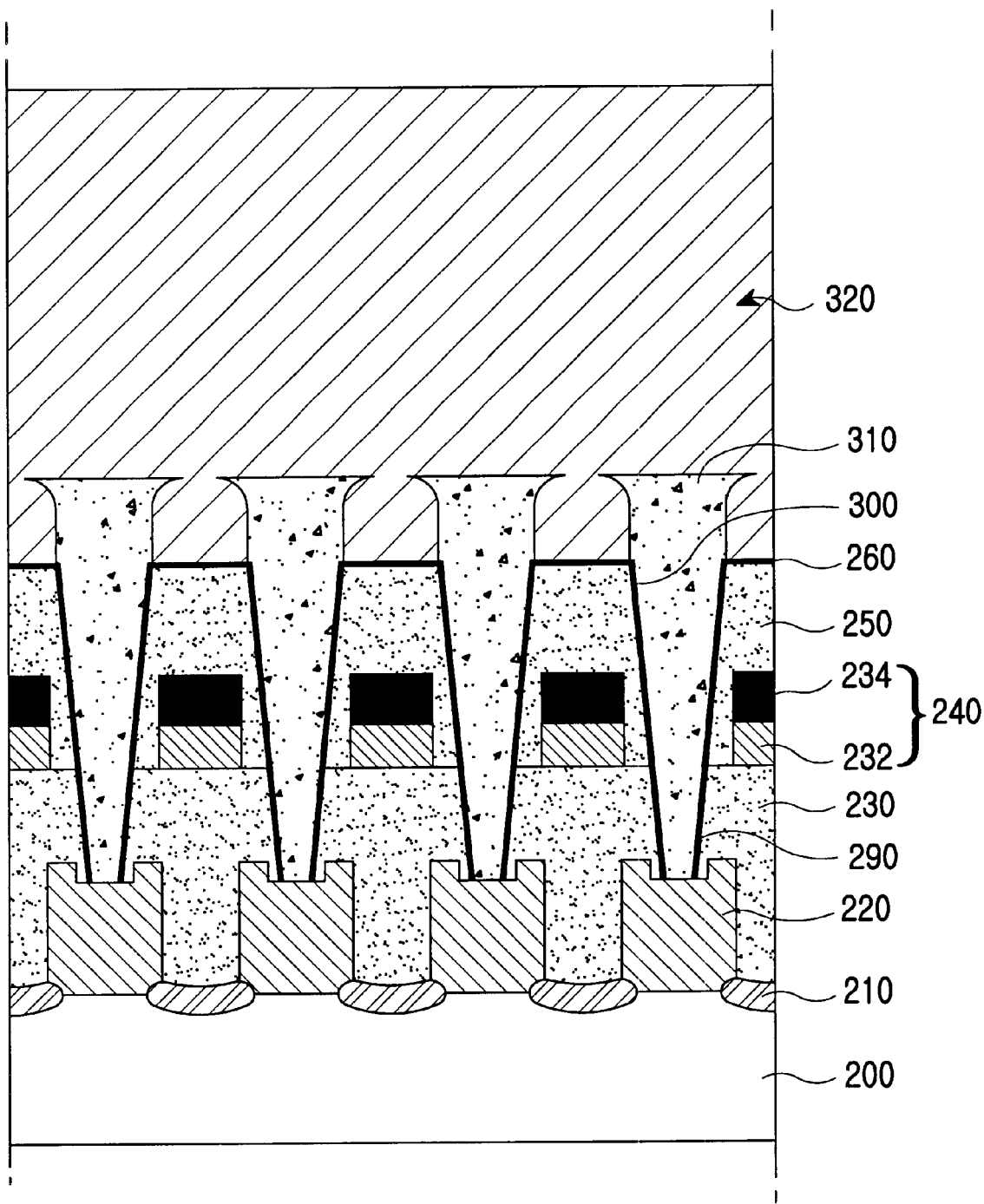

Referring to FIG. 13, a second conductive layer 320 such as a doped polysilicon layer is then deposited over the resulting structure to a thickness of about 5,000 Å or more, taking a desired cell capacitance into consideration. The second conductive layer 320 is made of the same conductive material as that of the plugging bars 310. The deposition of the second conductive layer 320 is carried out in such a manner that the second conductive layer 320 completely fills gaps each defined between adjacent ones of the plugging bars 310.

Figure 14:
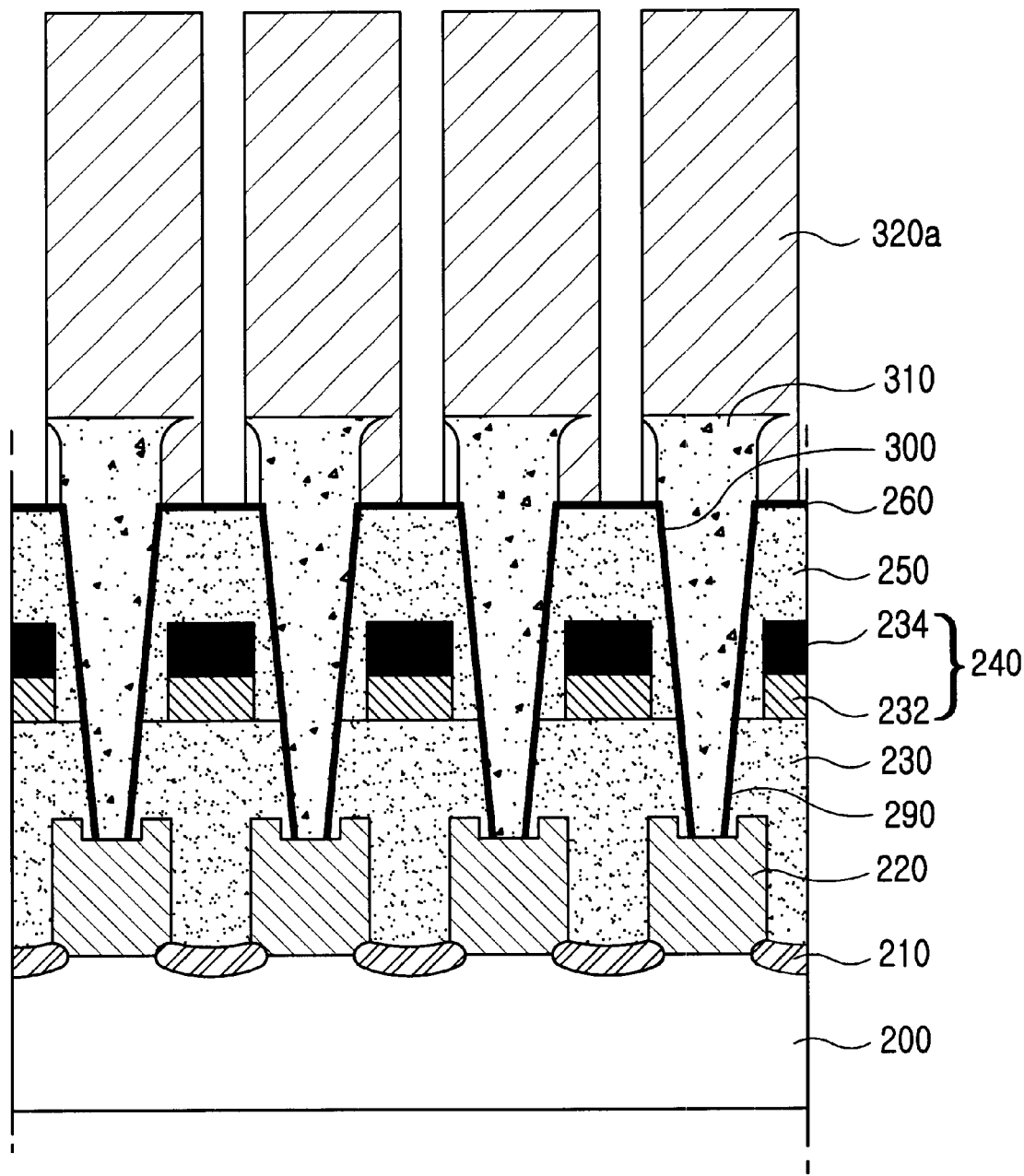

Referring to FIG. 14, the second conductive layer 320 and plugging bars 310 are then patterned using a photoetching process, thereby forming storage node electrodes 320a of capacitors. During the photoetching process for forming the storage node electrodes 320a, the plugging bars 310 are not abnormally etched at the top ends of the buried contact holes 290, even when the photomask used in the photoetching process is misaligned from the buried contact holes 290. This is because each buried contact hole 290 has, at the top end thereof, a vertical profile obtained in accordance with the wet etching process conducted for the insulating layer 270.

The above mentioned embodiments of the present invention are implemented in conjunction with a COB structure in which storage node electrodes are arranged above bit lines. However, the present invention may also be applied to a CUB structure in which storage node electrodes are arranged under bit lines. In addition, the present invention may be effective on semiconductor devices, other than DRAMs, requiring the formation of contact holes having a high aspect ratio.

As apparent from the above description, the present invention provides a buried contact hole structure in a semiconductor device in which buried contact holes have a vertical profile at respective top ends thereof. During a photoetching process for forming storage node electrodes, accordingly, the material of those storage node electrodes is not abnormally etched at respective top ends of associated buried contact holes, even when the photomask used in the photoetching process is misaligned from the buried contact holes.

While the present invention has been described in detail with reference to the specific embodiment, they are mere exemplary applications. Thus, it is to be clearly understood that many variations can be made by anyone skilled in the art within the scope and spirit of the present invention.

What is claimed is:

1. A method for fabricating a semiconductor device, comprising:
   depositing a first interlayer insulating layer over a semiconductor substrate having a semiconductor element formed thereon;
   forming a first line on the first interlayer insulating layer to be connected to the semiconductor element via a contact formed through the first interlayer insulating layer;
   depositing a second interlayer insulating layer over the first line and the first interlayer insulating layer;
   depositing an etch barrier layer on the second interlayer insulating layer;
   depositing, over the etch barrier layer, a cap insulating layer having a wet etch selectivity with respect to the second interlayer insulating layer;
   etching the cap insulating layer, the etch barrier layer, and the second interlayer insulating layer, thereby forming a buried contact hole to expose the semiconductor element;
   forming an insulating spacer on a side wall of the buried contact hole;
   wet etching at least a portion of the cap insulating layer; to leave a planar surface; and
   depositing a conductive layer over the resulting structure, and patterning the conductive layer, thereby forming a second line connected to the semiconductor element via the buried contact hole.

2. The method according to claim 1, further comprising:
   forming, prior to the deposition of the first interlayer insulating layer, a pair of spaced landing pads on the semiconductor substrate to be connected to the semiconductor element.

3. The method according to claim 1, wherein the step of wet etching the insulating layer is carried out using an etchant selected from the group consisting of hydrofluoric acid (HF), an SC-1, and a buffered oxide etchant (BOE).

4. The method according to claim 1, wherein the etch barrier layer is comprised of nitride, and the cap insulating layer is comprised of oxide having a high wet etch selectivity.

5. The method according to claim 1, wherein the insulating spacer comprises nitride.

6. The method according to claim 1, wherein the first line forms a bit line, and the second line forms a storage node electrode of a capacitor.

7. A method for making a semiconductor device, comprising:
   depositing a first interlayer insulating layer over a semiconductor substrate having a semiconductor element formed on an upper surface of the semiconductor substrate;
   forming a first line on the first interlayer insulating layer to be connected to the semiconductor element via a contact hole formed through the first interlayer insulating layer;
   depositing a second interlayer insulating layer over the first line and the first interlayer insulating layer;
   depositing an etch barrier layer on the second interlayer insulating layer;
   depositing, over the etch barrier layer, a cap insulating layer having a wet etch selectivity with respect to the etch barrier layer;
   etching the cap insulating layer, the etch barrier layer, and the second interlayer insulating layer, there forming a buried contact hole to expose the semiconductor element;
   forming an insulating spacer on an inner side wall of the buried contact hole;
   depositing a first conductive layer over the resulting structure obtained, and removing the first conductive layer until an upper surface of the insulating layer is exposed, thereby forming a plug in the buried contact hole;
   wet etching at least a portion of the cap insulating layer; to leave a planar surface; and
   depositing a second conductive layer over the resulting structure obtained, and patterning the second conductive layer, thereby forming a second line connected to the plug.

8. The method according to claim 7, further comprising:
   forming, prior to the deposition of the first interlayer insulating layer, a pair of spaced apart landing pads on the semiconductor substrate in such a manner that they are connected to the semiconductor element.

9. The method according to claim 7, wherein the step of wet etching the insulating layer is carried out using an etchant selected from the group consisting of hydrofluoric acid (HF), an SC-1, and a buffered oxide etchant (BOE).

10. The method according to claim 7, wherein the wet barrier layer is comprised of nitride, and the insulating layer is comprised of oxide having a high wet etch selectivity.

11. The method according to claim 7, wherein the insulating spacer is comprised of nitride.

12. The method according to claim 7, wherein the first conductive layer is deposited to a thickness capable of sufficiently filling the buried contact hole.

13. The method according to claim 7, wherein the step of removing the first conductive layer is carried out using an etch-back process or a chemical mechanical polishing process.

14. The method according to claim 7, wherein the first conductive layer has a doping concentration higher than that of the second conductive layer.

15. The method according to claim 7, wherein the first line forms a bit line, and the second line forms a storage node electrode of a capacitor.

16. A method for making a dynamic random access memory device comprising:

forming a pair of landing pads on a semiconductor substrate, defined with an active region and formed with a word line, in such a fashion that they are connected to exposed portions of the active region not covered by the word line;

depositing a first interlayer insulating layer over the pair of landing pads;

forming, on the first interlayer insulating layer, a bit line connected to one of the landing pads via a contact hole formed through the first interlayer insulating layer;

depositing a second interlayer insulating layer over the first line and the first interlayer insulating layer;

depositing an etch barrier layer over the second interlayer insulating layer;

depositing, over the etch barrier layer, a cap insulating layer having a wet etch selectivity with respect to the etch barrier layer;

etching the cap insulating layer, the etch barrier layer, and the second interlayer insulating layer, thereby forming a buried contact hole to expose the other one of the landing pads;

forming an insulating spacer on an inner side wall of the buried contact hole;

wet etching at least a portion of the cap insulating layer to form a substantially vertical profile at the top end of the buried contact hole; and depositing a conductive layer over the resulting structure, and patterning the conductive layer, thereby forming a storage node electrode of a capacitor connected to the other landing pad via the buried contact hole.

17. The method according to claim 16, wherein the wet etching the cap insulating layer is carried out in such a fashion that the cap insulating layer is partially or completely removed.

18. The method according to claim 16, further comprising:

forming, before wet etching the cap insulating layer, a conductive plug in the buried contact hole.

19. A method for fabricating a semiconductor device, comprising:

depositing a first interlayer insulating layer over a semiconductor substrate having a semiconductor element formed thereon;

forming a first line on the first interlayer insulating layer to be connected to the semiconductor element via a contact formed through the first interlayer insulating layer;

depositing a second interlayer insulating layer over the first line and the first interlayer insulating layer;

depositing an etch barrier layer on the second interlayer insulating layer;

depositing, over the etch barrier layer, a cap insulating layer having a wet etch selectivity with respect to the second interlayer insulating layer;

etching the cap insulating layer, the etch barrier layer, and the first and second interlayer insulating layers to form a buried contact hole that exposes the semiconductor element;

removing at least a portion of the cap insulating layer so that the buried contact hole has a substantially vertical profile at a top end thereof; and depositing a second line over the resulting structure, and patterning the conductive layer to form an electrode connected to the semiconductor element via the buried contact hole.

20. The method according to claim 19, further comprising, before removing at least a portion of the cap insulating layer, forming an insulating spacer on a side wall of the buried contact hole.

21. The method according to claim 19, wherein the removing comprises wet etching.

22. A method for fabricating a semiconductor device, comprising:

depositing an interlayer insulating layer over a semiconductor substrate having a semiconductor element formed thereon;

depositing an etch barrier layer on the interlayer insulating layer;

depositing, over the etch barrier layer, a cap insulating layer having a wet etch selectivity with respect to the etch barrier layer;

etching the cap insulating layer, the etch barrier layer, and the interlayer insulating layer to form a buried contact hole that exposes the semiconductor element;

forming an insulating spacer on a side wall of the buried contact hole;

wet etching at least a portion of the cap insulating layer so that the buried contact hole has a substantially vertical profile at a top end thereof; and depositing a conductive layer over the resulting structure, and patterning the conductive layer to form an electrode connected to the semiconductor element via the buried contact hole.

23. A method for making a semiconductor device, comprising:

depositing a first interlayer insulating layer over a semiconductor substrate having a semiconductor element formed on an upper surface of the semiconductor substrate;

forming a first line on the first interlayer insulating layer to be connected to the semiconductor element via a contact hole formed through the first interlayer insulating layer;

depositing a second interlayer insulating layer over the first line and the first interlayer insulating layer;

depositing an etch barrier layer on the second interlayer insulating layer;

depositing, over the etch barrier layer, a cap insulating layer having a wet etch selectivity with respect to the second interlayer insulating layer;

etching the cap insulating layer, the etch barrier layer, and the first and second interlayer insulating layers, thereby forming a buried contact hole to expose the semiconductor element;

depositing a first conductive layer over the resulting structure, and removing the first conductive layer until an upper surface of the cap insulating layer is exposed, thereby forming a plug in the buried contact hole;

wet etching at least a portion of the cap insulating layer; to leave a planar surface; and depositing a second conductive layer over the resulting structure obtained, and patterning the second conductive layer, thereby forming a second line connected to the plug.

24. The method of claim 23, further comprising, before wet etching, forming an insulating spacer on an inner side wall of the buried contact hole.

25. A method for fabricating a semiconductor device, comprising:

depositing an interlayer insulating layer over a semiconductor substrate having a semiconductor element formed thereon;

depositing an etch barrier layer on the interlayer insulating layer;

depositing, over the etch barrier layer, a cap insulating layer having a wet etch selectivity with respect to the etch barrier layer;

etching the cap insulating layer, the etch barrier layer, and the interlayer insulating layer to form a buried contact hole that exposes the semiconductor element;

forming an insulating spacer on a side wall of the buried contact hole;

removing at least a portion of the cap insulating layer; to leave a planar surface; and depositing a conductive layer over the resulting structure, and patterning the conductive layer to form an electrode connected to the semiconductor element via the buried contact hole.

26. The method of claim 25, wherein the removing comprises substantially removing a slope from the cap insulating layer.

27. The method of claim 25, wherein the removing comprises wet etching.

* * * * *

UNITED STATES PATENT AND TRADEMARK OFFICE
CERTIFICATE OF CORRECTION

PATENT NO. : 6,589,837 B1
DATED : July 8, 2003
INVENTOR(S) : Ban et al.

It is certified that error appears in the above-identified patent and that said Letters Patent is hereby corrected as shown below:

Title page,
Item [56], References Cited, U.S. PATENT DOCUMENTS,
"5,409,855 A   4/1995 Jun ......... 437/42" should read
-- 5,409,855 A   4/1995 Jun ............. 437/52 --.

Column 5,
Line 54, "tungsten suicide layer." should read -- tungsten silicide layer. --.

Column 8,
Line 1, "250 and first" should read -- 250, and first --.

Signed and Sealed this

Thirtieth Day of March, 2004

JON W. DUDAS
*Acting Director of the United States Patent and Trademark Office*